US011412639B2

(12) United States Patent
Eidem et al.

(10) Patent No.: US 11,412,639 B2
(45) Date of Patent: Aug. 9, 2022

(54) EMERGENCY COOLING DEVICE

(71) Applicant: INTERNATIONAL BUSINESS MACHINES CORPORATION, Armonk, NY (US)

(72) Inventors: Jessica R. Eidem, Rochester, MN (US); Stephen P. Mroz, Rochester, MN (US); Marvin M. Misgen, Rochester, MN (US); Phillip V. Mann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 385 days.

(21) Appl. No.: 16/354,642

(22) Filed: Mar. 15, 2019

(65) Prior Publication Data

US 2020/0296863 A1    Sep. 17, 2020

(51) Int. Cl.
*H05K 7/20* (2006.01)
*G06F 11/30* (2006.01)
*H05K 7/14* (2006.01)

(52) U.S. Cl.
CPC ..... *H05K 7/20836* (2013.01); *H05K 7/20145* (2013.01); *H05K 7/20736* (2013.01);
(Continued)

(58) Field of Classification Search
CPC .......... H05K 7/20836; H05K 7/20872; H05K 7/20736; H05K 7/20381; H05K 7/20645;
(Continued)

(56) References Cited

U.S. PATENT DOCUMENTS 2,310,086 A * 2/1943 Howard ................. F28F 27/00
165/86
2,391,558 A   12/1945 Essick
(Continued)

FOREIGN PATENT DOCUMENTS

| CN | 106358428 A | 1/2017 |
| CN | 207354790 U | 5/2018 |
| KR | 2020120008242 U | * 12/2003 |

OTHER PUBLICATIONS

Kuul, "Control Series," The Kuul Effect, p. 1-4, https://www.thekuuleffect.com/control, Accessed on Mar. 14, 2019.
(Continued)

*Primary Examiner* — Harry E Arant
(74) *Attorney, Agent, or Firm* — L. Jeffrey Kelly (57) ABSTRACT

An apparatus for cooling warm air, including a rack containing one or more ventilation slots; a reservoir connected to the rack that contains a cooling solution; and a plurality of components, located within the rack, that receive and distribute the cooling solution from the reservoir. The plurality of components consist of at least one of the following structures: one or more hollow vertical louvers, one or more hollow horizontal louvers, one or more hollow diagonal louvers, and one or more hollow cylindrical louvers. Additionally, the plurality of components may comprise a flexible material that descends from a top portion of the rack, directly below the reservoir, at the same time that an activation component causes the cooling solution to flow from the reservoir into the flexible material.

14 Claims, 9 Drawing Sheets

(52) U.S. Cl.
CPC ...... *G06F 11/3044* (2013.01); *G06F 11/3062* (2013.01); *H05K 7/1492* (2013.01)

(58) Field of Classification Search
CPC .............. H05K 7/20681; F28F 2265/02; F28F 2265/10
See application file for complete search history.

(56) References Cited

U.S. PATENT DOCUMENTS

| | | | | |
|---|---|---|---|---|
| 4,899,812 | A * | 2/1990 | Altoz | .................... B01F 5/0616 138/38 |
| 6,305,180 | B1 * | 10/2001 | Miller | ................ H05K 7/20572 165/104.33 |
| 6,367,278 | B1 | 4/2002 | Strussion et al. | |
| 6,533,253 | B1 | 3/2003 | Calvert | |
| 6,796,136 | B1 | 9/2004 | Sullivan et al. | |
| 9,829,896 | B1 | 11/2017 | Arend et al. | |
| 2004/0008483 | A1 * | 1/2004 | Cheon | ....................... G06F 1/20 361/679.53 |
| 2011/0292601 | A1 * | 12/2011 | Campbell | ............ H05K 5/0213 361/691 |
| 2013/0021746 | A1 * | 1/2013 | Campbell | ............ H05K 7/2079 361/679.47 |
| 2014/0049918 | A1 * | 2/2014 | Chainer | ............ H05K 7/20772 361/702 |
| 2014/0174116 | A1 | 6/2014 | Habeebullah | |
| 2017/0064875 | A1 | 3/2017 | Casey et al. | |
| 2020/0245511 | A1 * | 7/2020 | Kulkarni | ............ H05K 7/20818 |

OTHER PUBLICATIONS https://www.energy.gov/energysaver/evaporative-coolers, "Evaporative Coolers", Energy Saver, Department of Energy, Accessed on Jun. 8, 2021, 6 pages.

* cited by examiner

FIG. 7
SECTION X-X

FIG. 8
SECTION X-X

EMERGENCY COOLING DEVICE

BACKGROUND

The present disclosure generally relates to a cooling system, and apparatus, for a server rack, or any other electronic equipment cabinet.

Computer cooling is required to remove the waste heat produced by computer components and to keep components within permissible operating temperature limits. Cooling may be designed to reduce the ambient temperature within the case of a computer. Various existing cooling techniques, such as heatsinks, computer fans, and liquid cooling, are designed to reduce the temperature rise produced by computer hardware, thereby avoiding any interruptions of computer operations.

On a larger scale, a data center is a building, or a dedicated space within a building, used to house computer systems and associated components. Since information technology (IT) operations are critical for business continuity, any lapse in computer systems performance within a data center may have detrimental effects for a business.

SUMMARY

Embodiments of the disclosure provide an apparatus for cooling hardware, including a rack or any other electronic equipment cabinet known to one of ordinary skill in the art, containing one or more ventilation slots; a reservoir connected to the rack that contains a cooling solution; and a plurality of components, located within the rack, that receive and distribute the cooling solution from the reservoir.

Exemplary embodiments can further include a flexible material that descends from a top portion of the rack, directly below the reservoir, at the same time that an activation component causes the cooling solution to flow from the reservoir into the flexible material.

Embodiments of the disclosure provide a method for cooling hardware using an apparatus, wherein the apparatus includes a rack or any other electronic equipment cabinet known to one of ordinary skill in the art, containing one or more ventilation slots; a reservoir connected to the rack that contains a cooling solution; and a plurality of components, located within the rack, that receive and distribute the cooling solution from the reservoir, and wherein the method includes detecting a change in temperature, beyond a threshold value, and releasing a cooling solution from the reservoir, wherein the cooling solution flows through the plurality of components within the rack. The method further includes redirecting incoming air, via the one or more ventilation slots in the rack, through the plurality of components containing the cooling solution, wherein the plurality of components containing the cooling solution cools down the redirected incoming air, and directing the cooled down redirected incoming air, that passes through the plurality of components, towards contents within the rack.

BRIEF DESCRIPTION OF THE DRAWINGS

Embodiments of the present disclosure will now be described, by way of example only, with reference to the following drawings in which.

DETAILED DESCRIPTION

Embodiments of the present disclosure provide a cooling system for a computer system hardware rack or any other electronic equipment cabinet known to one of ordinary skill in the art, typically located within a climate-controlled server room. The embodiments discussed herein are not limited to climate-controlled server room or system hardware racks, and may be used to cool other hardware equipment in various temperature environments known to one of ordinary skill in the art.

A computer rack, commonly called a rack, is typically a metal frame used to hold various hardware devices such as servers, hard disk drives, modems, and other electronic equipment. One of ordinary skill in the art may refer to a rack as "local area network (LAN) or network furniture," as it resembles a shelving structure where components can be attached vertically, stacked on top of one another. A computer rack may also be called a relay rack or open rack.

In exemplary embodiments, multiple computer racks are stored in enclosed rooms known as server rooms. A server room is a room, usually air-conditioned, devoted to the continuous operation of computer servers. An entire building or station devoted to this purpose is a data center.

Data centers typically contain many racks of thin, horizontally mounted servers. Air is drawn in at the front of the rack and exhausted at the rear. Because data centers typically contain large numbers of computers and other power-dissipating devices, they risk equipment overheating. Nowadays, extensive heating, ventilation, and air conditioning (HVAC) systems are used to prevent equipment overheating. However, HVAC systems may fail altogether or encounter temporary shutdowns or blockages.

The present disclosure is an improvement to air-conditioning, or cooling, requirements in the event of an emergency with the HVAC system within the server room (e.g., air-conditioning malfunction or shutdown).

Computer equipment generates heat, and is sensitive to heat, humidity, and dust. Maintaining a stable temperature and humidity level within tight tolerances is critical to IT system reliability.

Over time, various methods to cool system hardware, especially for supercomputers and datacenters that generate a lot of heat, have been developed and implemented. However, each of these methods has its drawbacks. Therefore, it is advantageous to have a technology that can facilitate equipment cooling in the event of an emergency.

The present disclosure provides an apparatus with a built-in emergency cooling system in the event that there is an air-conditioning, or temperature control, failure within the server room. The present invention is not limited to hardware within a server room, but may be applied to alternative pieces of hardware located within various temperature-controlled environments known to one of ordinary skill in the art.

The present invention makes a general reference to server terminology, however, is not limited to server terminology or use. In alternative embodiments, server may be substituted with electronic equipment room, electronic equipment rack, or any other hardware rack, or equipment.

There are various benefits of the present invention over the existing technology. The present invention is easy to implement, easy to service, and does not require design changes of existing racks and/or equipment. Additionally, the present invention allows servers to stay running longer in an elevated-temperature event versus shutting down, reducing performance, or failing.

Further benefits of the present invention over the existing technology include: the present invention is easy to reuse after an event occurs, and is scalable anywhere from individual parts and/or components, server level, rack row level, and up to datacenter level.

Embodiments of the invention will now be described in greater detail with direct reference to the Figures.

Figure 1:
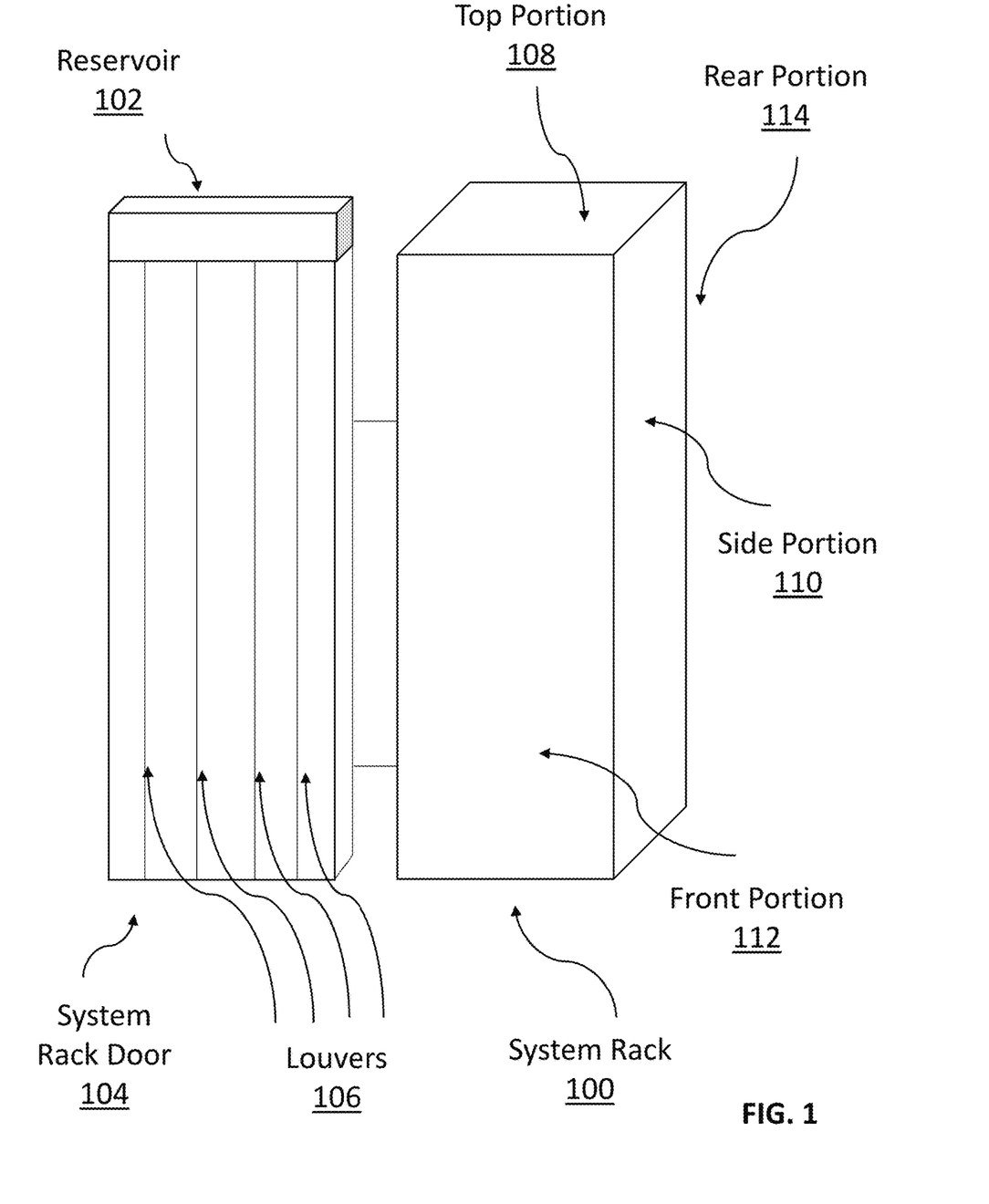
FIG. 1 is a diagrammatic illustration of a system rack containing an integrated reservoir and louvers, in accordance with embodiments of the present disclosure.

FIG. 1 depicts a system rack 100, with system rack door 104 open. In exemplary embodiments, system rack 100 includes one or more ventilation slots located on system rack door 104; reservoir 102, attached to the top of system rack door 104, that contains a cooling solution; and louvers 106, which are a plurality of components, located within system rack door 104, that receive and distribute the cooling solution from reservoir 102.

In exemplary embodiments, the reservoir 102, together with cooling solution and louvers 106, are collectively referred to as the cooling apparatus. In exemplary embodiments, the cooling apparatus is integrated into the system rack door 104. However in alternative embodiments, the cooling apparatus may be integrated into at least one or more portions of the system rack 100: a top portion 108, a side portion 110, a front portion 112, and a rear portion 114 of system rack 100.

Figure 2:
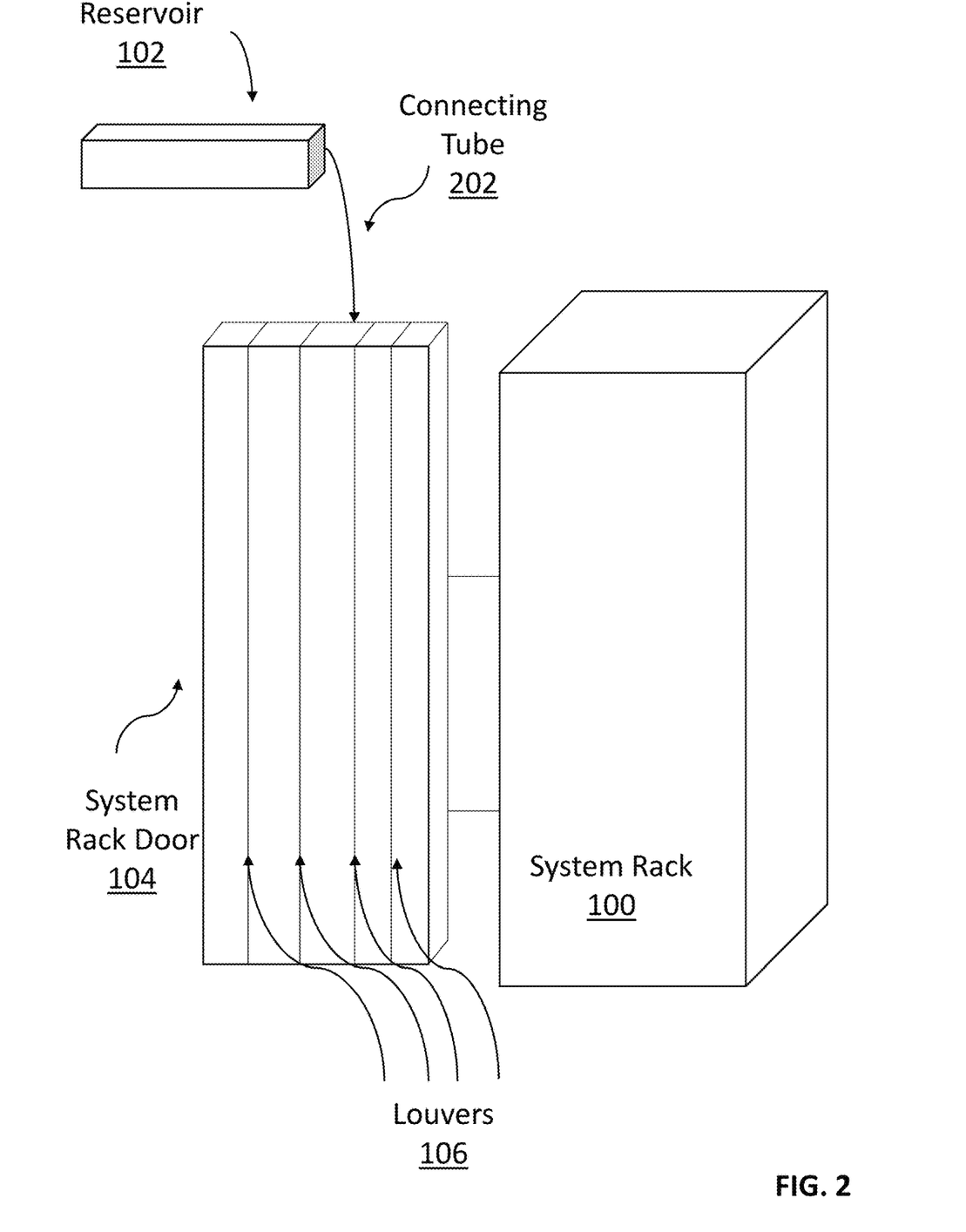
FIG. 2 is a diagrammatic illustration of a system rack containing integrated louvers connected to an external reservoir via a connecting tube, in accordance with embodiments of the present disclosure.

In alternative embodiments, the reservoir 102 may not be directly integrated into the system rack 100 but rather connected to the system rack 100, via a connecting tube 202, as depicted in FIG. 2.

FIG. 2 is a diagrammatic illustration of a system rack 100 containing integrated louvers 106 connected to an external reservoir 102 via a connecting tube 202, in accordance with embodiments of the present disclosure.

With reference to FIGS. 1 and 2, the connecting tube 202 serves as a conduit for the cooling solution to flow down from reservoir 102 to the louvers 106, located within system rack 100, which then receives and distributes the cooling solution.

Figure 5:
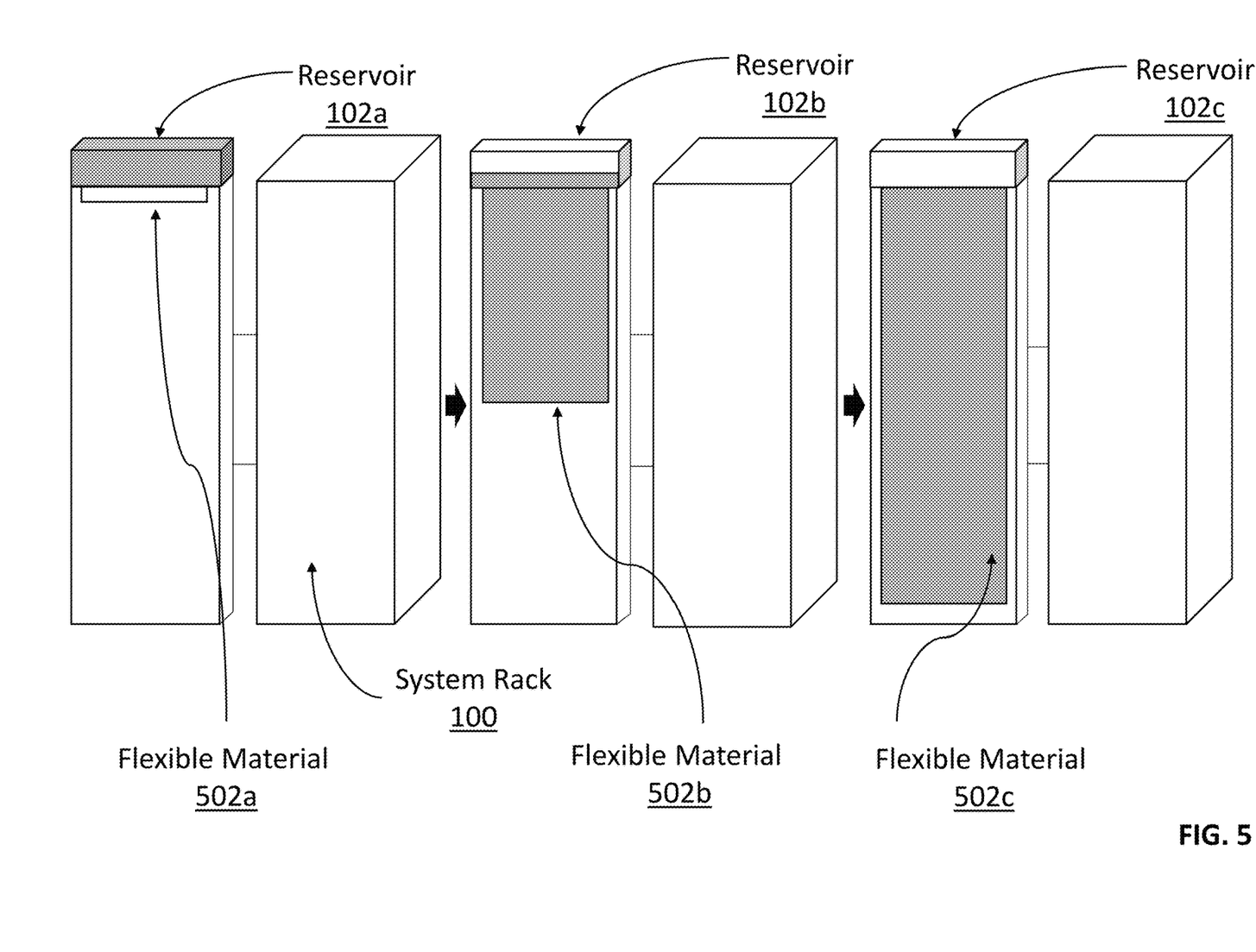
FIG. 5 is a stepwise diagrammatic illustration of a system rack containing a flexible material that drops down from the top of the system rack door, while simultaneously receiving cooling solution from the reservoir, in accordance with embodiments of the present disclosure.

In exemplary embodiments, system rack door 104 remains closed during operation. In FIGS. 1, 2, and 5 the system rack door 104 is depicted as being open for illustrative purposes only.

In exemplary embodiments, system rack 100 is a server rack.

In exemplary embodiments, the reservoir 102 and louvers 106 are integrated directly into the system rack 100 during manufacturing. However, in alternative embodiments, the reservoir 102 may be manufactured as an add-on feature that is customizable to a system rack 100. In further alternative embodiments, a reservoir 102 together with a connecting tube 202, connecting reservoir 102 to one or more system racks 100 containing louvers 106, may be added onto the ceiling at a datacenter or server room, rather than integrated directly into a system rack 100, as depicted in FIG. 1. In additional alternative embodiments, the reservoir 102 containing cooling solution may be portable and capable of being moved to an area of concern, for example within a row of system racks 100, containing louvers 106, at a datacenter.

In additional alternative embodiments, the reservoir 102, containing cooling solution, together with louvers 106, may not be attached to any system rack 100 until it is needed. For example, an emergency cooling kit, including a reservoir 102 with cooling solution, together with louvers 106, can be attached to a particular system rack 100 that needs cooling.

In alternative embodiments, the apparatus is a portable apparatus comprising a reservoir 102 that contains a cooling solution, and a plurality of components (e.g., louvers 106), connected to reservoir 102, that receive and distribute the cooling solution from the reservoir 102.

In alternative embodiments, the portable apparatus includes a reservoir 102 that is connected to the plurality of components (e.g., louvers 106) via a connecting tube 202.

In exemplary embodiments, the cooling solution may be Novec™ (Novec is a trademark of 3M Company of St. Paul Minn.), or any other evaporative fluid with similar properties, which is an electrically non-conductive liquid that can receive generated heat from electronic components.

Figure 6:
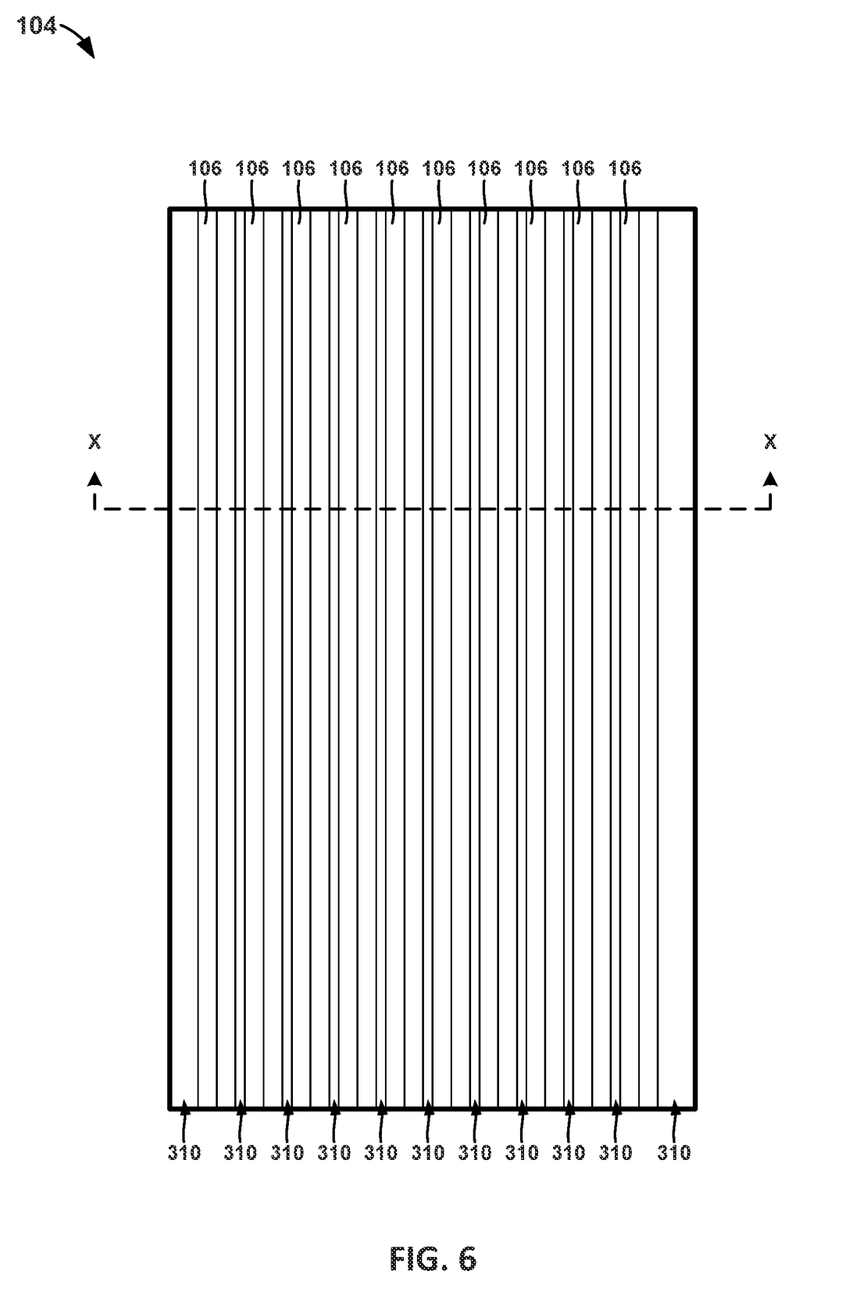
FIG. 6 is a diagrammatic illustration the system rack door, in accordance with embodiments of the present disclosure.
Figure 7:
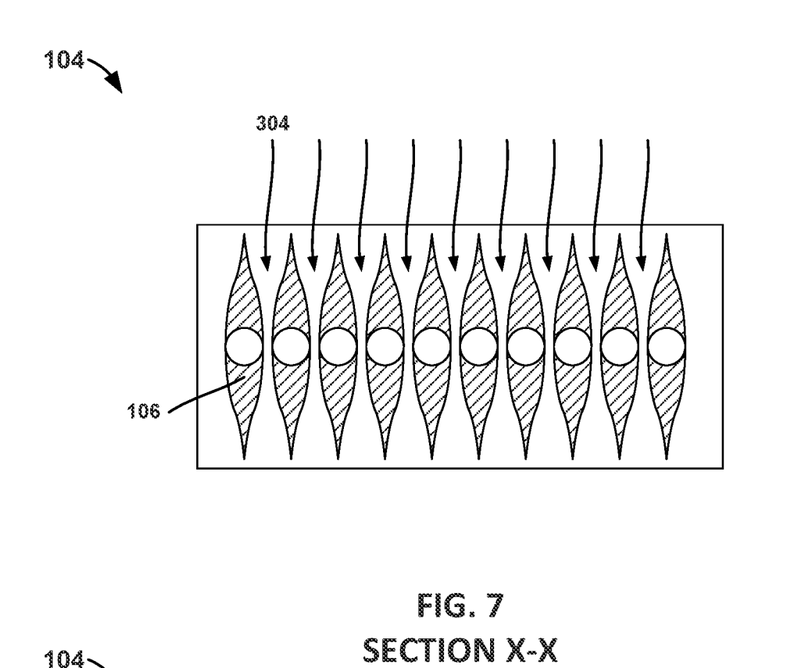
FIG. 7 is a cross-section view of FIG. 6, in accordance with embodiments of the present disclosure.
Figure 8:
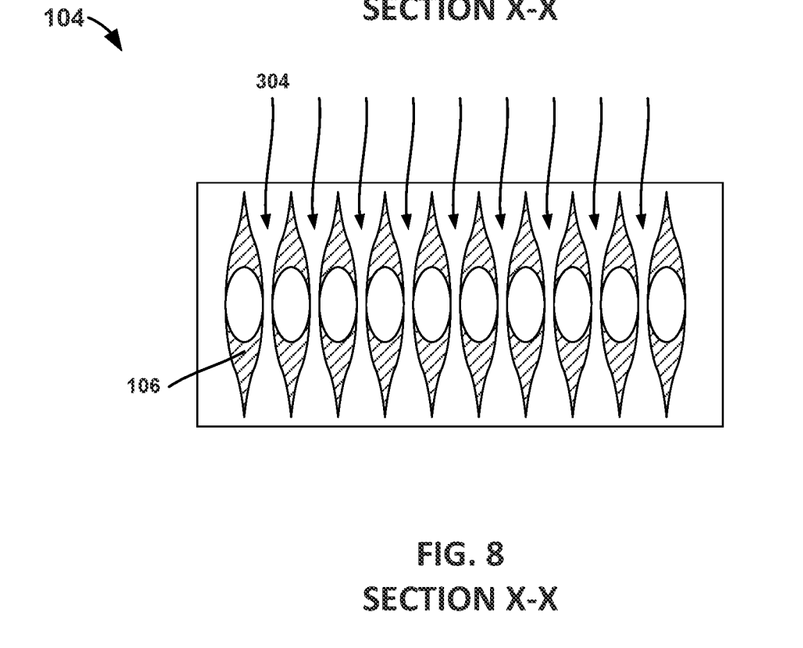
FIG. 8 is a cross-section view of FIG. 6, in accordance with embodiments of the present disclosure.
Figure 9:
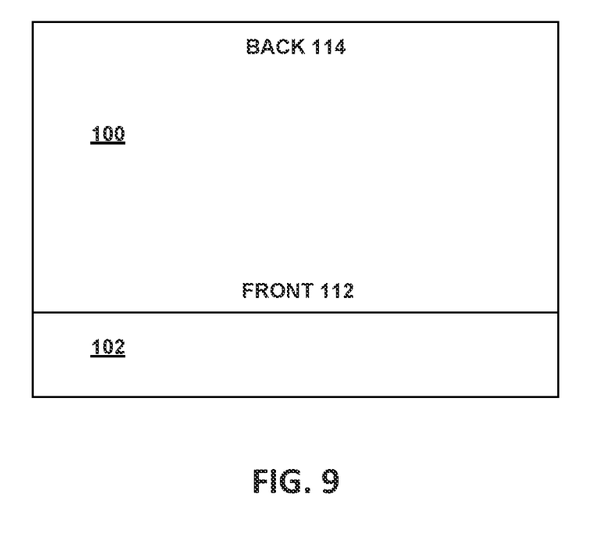
FIG. 9 is a top view of the system rack illustrating the relative placement of the external reservoir, in accordance with embodiments of the present disclosure.
Figure 10:
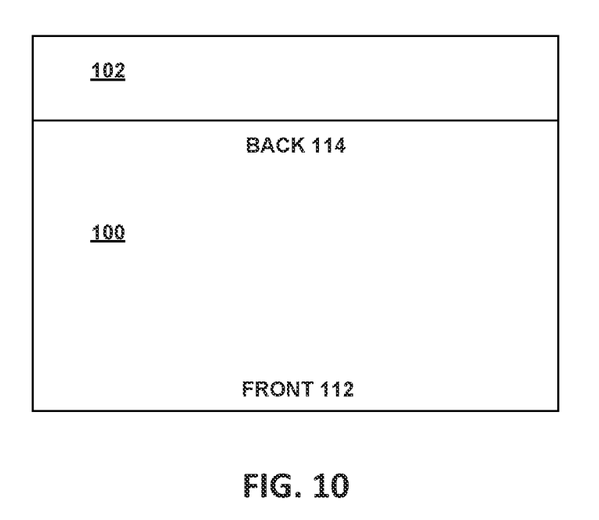
FIG. 10 is a top view of the system rack illustrating the relative placement of the external reservoir, in accordance with embodiments of the present disclosure.
Figure 11:
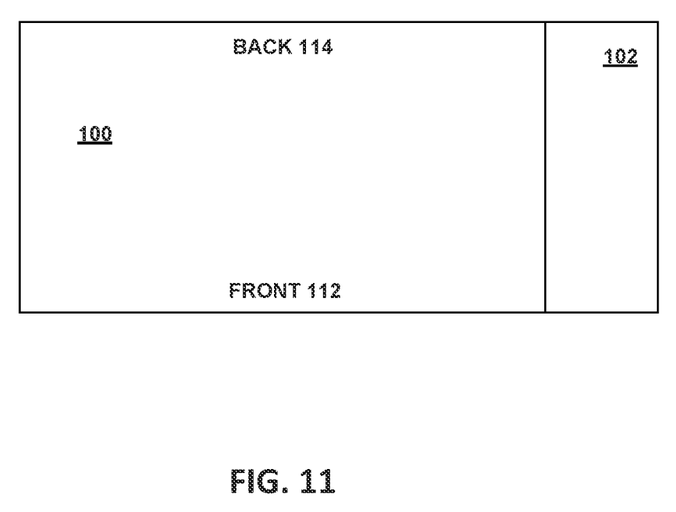
FIG. 11 is a top view of the system rack illustrating the relative placement of the external reservoir, in accordance with embodiments of the present disclosure.
Figure 12:
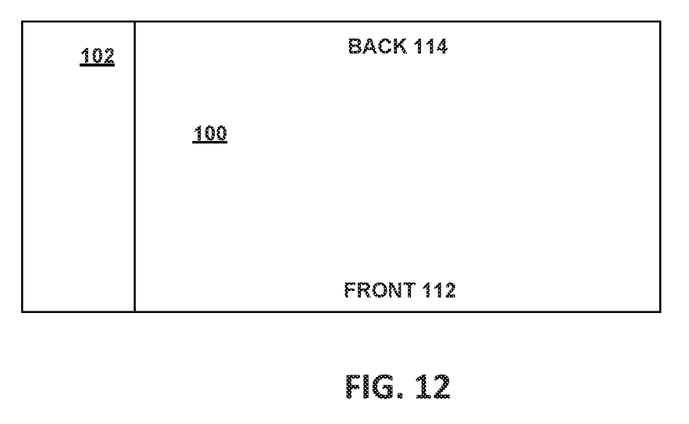
FIG. 12 is a top view of the system rack illustrating the relative placement of the external reservoir, in accordance with embodiments of the present disclosure.

In exemplary embodiments, the louvers 106 consist of at least one of the following structures: one or more hollow vertical louvers, one or more hollow horizontal louvers, one or more hollow diagonal louvers, and one or more hollow cylindrical louvers. See FIGS. 6-8.

In alternative embodiments, the louvers 106 may include any hollow shape that is capable of receiving cooling solution from reservoir 102 and distributing the cooling solution.

In exemplary embodiments, and with continued reference to FIGS. 1-2, the cooling solution located in reservoir 102 flows, via connecting tube 202 or directly, into the louvers 106, thereby cooling the incoming air into the system rack 100 via ventilation slots. In exemplary embodiments, the cooling solution located in reservoir 102 may flow in any direction.

In exemplary embodiments, the cooling solution remains in reservoir 102 until a temperature change is detected beyond a threshold value. Upon detection of a temperature change beyond a threshold value, the cooling solution flows out of reservoir 102 into louvers 106.

In exemplary embodiments, a change in temperature is detected by one or more sensors on system rack 100 that can detect a thermal failure or need for additional cooling.

In alternative embodiments, a change in temperature is detected by one or more thermal sensors on system rack 100 that can detect higher server room ambient temperatures.

In further alternative embodiments, the cooling solution in reservoir 102 may be released from reservoir 102 upon receiving one or more server room alerts that warns of a sudden, or incoming, air conditioning unit failure.

In other embodiments, the cooling solution in reservoir 102 may be released from reservoir 102 upon receiving one or more power grid notices that warn of high, or increasing power costs, and an intent to reduce air conditioner utilization.

Figure 3:
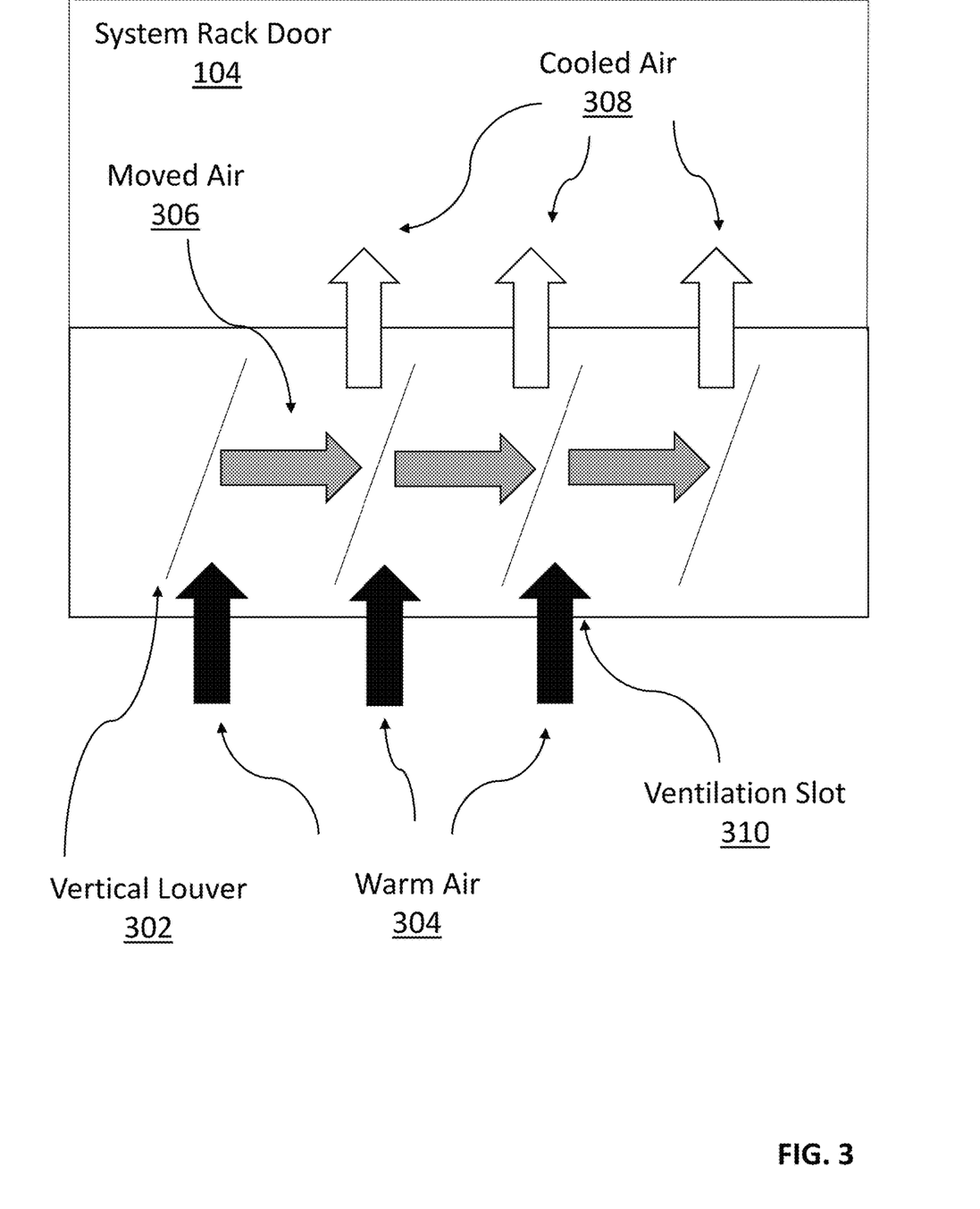
FIG. 3 is a top view of a system rack illustrating the movement of warm air through the ventilation slots of a system rack containing vertical louvers, and how the cooling of the airflow works, in accordance with embodiments of the present disclosure.

FIG. 3 is a top view of a system rack 100 illustrating the movement of warm air 304 through the ventilation slots 310 of a system rack 100 containing vertical louvers 302, and how the cooling of the airflow works, in accordance with embodiments of the present disclosure.

With reference to FIG. 3, warm air 304 enters system rack 100 via one or more ventilation slots 310 in system rack 100. The warm air 304 is moved through the liquid-filled vertical louvers 302 (moved air 306), which cools the warm air 304 down. The cooled air 308 enters the system rack 100.

Figure 4:
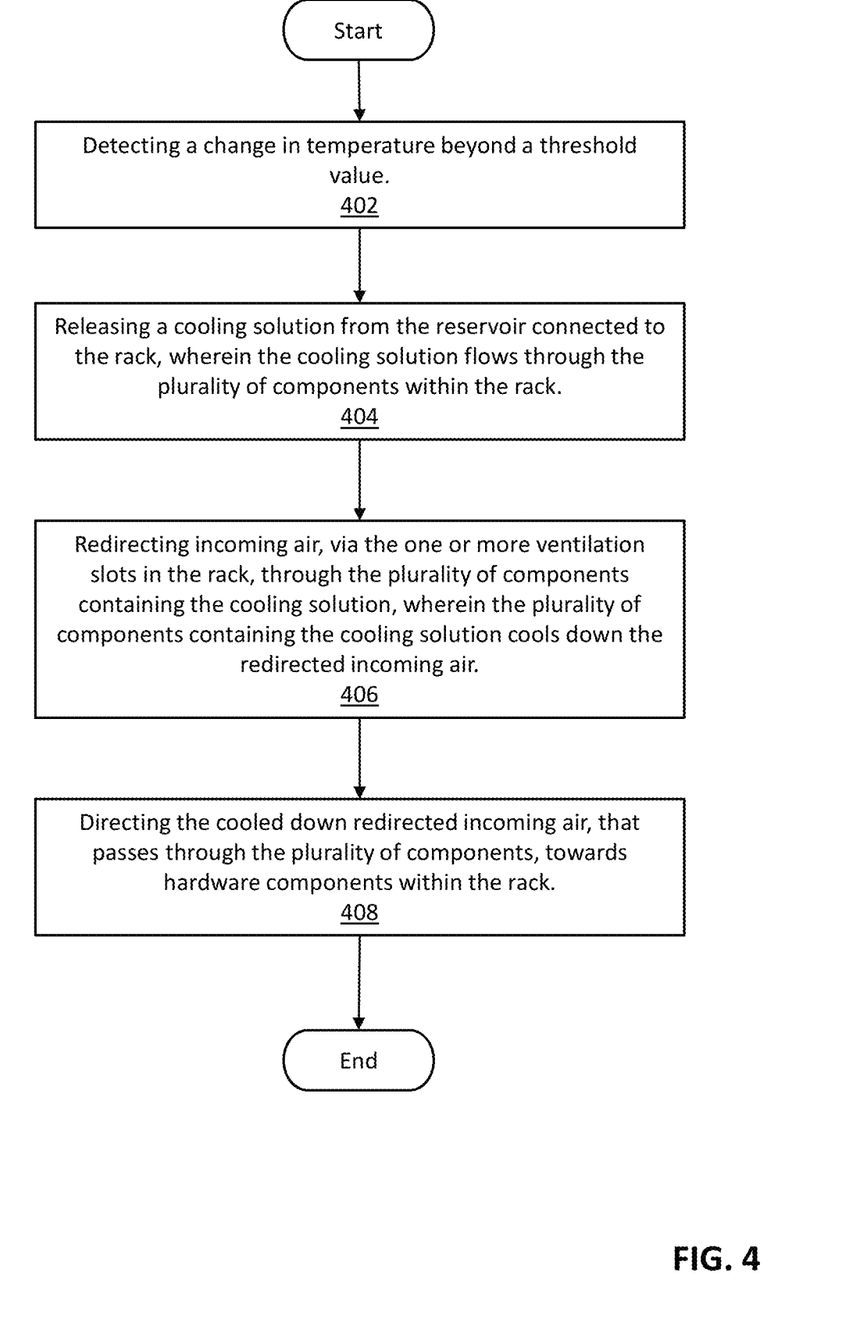
FIG. 4 is a flowchart illustrating the cooling of airflow through a system rack, in accordance with an embodiment of the present disclosure.

FIG. 4 is a flowchart illustrating the cooling of airflow through system rack 100, in accordance with an embodiment of the present disclosure.

In exemplary embodiments, the present disclosure provides a method for cooling warm air using the disclosed apparatus, wherein the apparatus comprises a system rack, containing one or more ventilation slots; a reservoir, connected to the rack, that contains a cooling solution; and a plurality of components (e.g., louvers, flexible material), located within the system rack, that receive and distribute the cooling solution from the reservoir.

With reference to FIGS. 1-4, the method detects a change in temperature, beyond a threshold value (step 402) and releases a cooling solution from the reservoir 102 connected to the system rack door 104, wherein the cooling solution flows through the louvers 106 (or vertical louvers 302 as depicted in FIG. 3) located within the system rack door 104 (step 404). In alternative embodiments, the cooling solution is released from reservoir 102, which can be connected to another part of the system rack 100 (e.g., top portion 108, rear portion 114, side portion 110, and front portion 112), wherein the cooling solution flows through the louvers 106, or vertical louvers 302.

In exemplary embodiments, the method redirects incoming warm air 304, via the one or more ventilation slots 310 in the system rack door 104, through the louvers 106 (or vertical louvers 302 as depicted in FIG. 3) containing the cooling solution, wherein the louvers 106 containing the cooling solution cool down the redirected incoming air (e.g., moved air 306) (step 406).

The method directs the cooled air 308, that passed through the louvers 106 (or vertical louvers 302 as depicted in FIG. 3) containing the cooling solution, towards hardware components within the system rack 100 (step 408).

FIG. 5 is a stepwise diagrammatic illustration of a system rack 100 containing a flexible material 502a-c that drops down from the top of the system rack door 104, while simultaneously receiving cooling solution from reservoir 102a-c, in accordance with embodiments of the present disclosure.

In exemplary embodiments, the flexible material 502a-c can be a hollow material, or another type of flexible material that is capable of being filled up with a liquid. In exemplary embodiments, the flexible material 502a-c is capable of rolling up and rolling down the system rack door 104, directly below reservoir 102a-c.

In exemplary embodiments, flexible material 502a remains rolled up at the top of system rack door 104 when the cooling solution is not needed, and reservoir 102a remains filled up with cooling solution. If the temperature reaches a threshold value, thus requiring the cooling solution to be released, then the flexible material 502b begins descending, while simultaneously filling up with the cooling solution from reservoir 102b, as illustrated with reference to FIG. 5.

With continued reference to FIG. 5, the flexible material 502c descends to the bottom of the system rack door 104 and the flexible material 502c is completely descended and filled with the cooling solution from reservoir 102c. The incoming warm air passes through ventilation slots in system rack 100, comes into contact with the liquid filled flexible material 502c, and gets cooled down prior to reaching the system hardware contained within the system rack 100.

In exemplary embodiments, flexible material 502c returns to a rolled-up position (i.e., flexible material 502a) after an emergency temperature condition is stabilized and the emergency cooling is no longer required.

In exemplary embodiments, the cooling solution evaporates, after a fixed amount of time, when it flows from the reservoir 102 into the louvers 106 and/or flexible material 502c, located within the system rack 100. In exemplary embodiments, the evaporated cooling solution may be collected from condensed air within a confined space housing the system rack 100 (e.g., data center), for reuse.

The invention claimed is:

1. An apparatus, comprising:
a rack, containing one or more ventilation slots;
a reservoir, connected to the rack, that contains a cooling solution; and
a flexible material that receives and distributes the cooling solution from the reservoir, wherein the flexible material descends from a top portion of the rack at the same time that an activation component causes the cooling solution to flow from the reservoir into the flexible material.

2. The apparatus of claim 1, wherein the flexible material is integrated into a front door of the rack.

3. The apparatus of claim 1, wherein the reservoir is located on at least one or more portions of the rack: a top portion of the rack, a side portion of the rack, a rear portion of the rack, and a front portion of the rack.

4. The apparatus of claim 1, wherein the cooling solution is a non-conductive, evaporative liquid that receives generated heat.

5. The apparatus of claim 1, wherein the cooling solution evaporates after it flows from the reservoir into the flexible material.

6. The apparatus of claim 1, wherein the rack is a server rack.

7. The apparatus of claim 1, wherein the flexible material receives the cooling solution from the reservoir via a connecting tube.

8. The apparatus of claim 1, wherein the flexible material is stored in a rolled-up configuration until it receives the cooling solution.

9. A method for cooling hardware components enclosed in a rack using a cooling apparatus, wherein the cooling apparatus comprises one or more ventilation slots; a reservoir containing a cooling solution and; and a flexible material capable of being filled with the cooling liquid, comprising:

detecting a change in temperature beyond a threshold value;

releasing the cooling solution from the reservoir into the flexible material, wherein the cooling solution flows into the flexible material and causes the flexible material to unroll from a stored position and descend toward a bottom of the rack;

redirecting incoming air, via the one or more ventilation slots, in a direction towards the flexible material containing the cooling solution, wherein contact with the flexible material containing the cooling solution reduces the temperature of the redirected incoming air.

10. The method of claim 9, further comprising:

directing the redirected incoming air having the reduced temperature towards the hardware components.

11. The method of claim 9, wherein the flexible material is integrated into a front door of the rack.

12. The method of claim 9, wherein the reservoir is located on at least one or more portions of the rack: a top portion of the rack, a side portion of the rack, a rear portion of the rack, and a front portion of the rack.

13. The method of claim 9, wherein the cooling solution is a non-conductive, evaporative liquid that receives generated heat.

14. The method of claim 9, wherein the cooling solution evaporates after it flows from the reservoir into the flexible material and is collected from condensed air for reuse.

* * * * *